(12) United States Patent
Tang et al.

(10) Patent No.: US 9,331,704 B2
(45) Date of Patent: May 3, 2016

(54) APPARATUS AND METHOD FOR GENERATING AN OSCILLATING OUTPUT SIGNAL

(71) Applicant: QUALCOMM Incorporated, San Diego, CA (US)

(72) Inventors: Yiwu Tang, San Diego, CA (US);
Jianyun Hu, San Diego, CA (US);
Chiewcharn Narathong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 108 days.

(21) Appl. No.: 13/757,666

(22) Filed: Feb. 1, 2013

(65) Prior Publication Data

US 2014/0218124 A1    Aug. 7, 2014

(51) Int. Cl.
*H03L 7/00* (2006.01)
*H03L 7/16* (2006.01)
(Continued)

(52) U.S. Cl.
CPC ............... *H03L 7/16* (2013.01); *H03B 5/1215* (2013.01); *H03B 5/1243* (2013.01); *H03B 5/1256* (2013.01); *H03B 5/1296* (2013.01); *H03C 3/0925* (2013.01); *H03C 3/0941* (2013.01); *H03C 3/0958* (2013.01); *H03B 2201/0208* (2013.01); *H03B 2201/0216* (2013.01); *H03L 7/00* (2013.01); *H03L 7/07* (2013.01); *H03L 7/101* (2013.01); *H03L 7/104* (2013.01); *H03L 7/187* (2013.01)

(58) Field of Classification Search
CPC ............. H03L 7/00; H03L 7/07; H03L 7/101; H03L 7/104; H03L 7/187; H03L 7/16; H03B 5/1296; H03B 5/1215; H03B 5/1243; H03B 5/1256; H03B 2201/0208; H03B 2201/0216; H03C 3/0925; H03C 3/0958; H03C 3/0941
USPC ............. 327/147, 156; 331/10, 16, 34, 36 C, 331/117 R, 117 FE, 167; 375/376
See application file for complete search history.

(56) References Cited

U.S. PATENT DOCUMENTS 5,696,468 A     12/1997  Nise
5,959,502 A *   9/1999  Ovens et al. ...................... 331/8
(Continued)

FOREIGN PATENT DOCUMENTS

EP          1717960  A2     11/2006

OTHER PUBLICATIONS

International Search Report and Written Opinion—PCT/US2014/013173—ISA/EPO—May 26, 2014.

*Primary Examiner* — Richard Tan

(57) ABSTRACT

An apparatus for generating an oscillating output signal includes an inductive-capacitive (LC) circuit and a current tuning circuit. The LC circuit includes a primary inductor and a varactor coupled to the primary inductor. A capacitance of the varactor is responsive to a voltage at a control input of the varactor. The current tuning circuit includes a secondary inductor and a current driving circuit coupled to the secondary inductor. The current driving circuit is responsive to a current at a control input of the current driving circuit. An effective inductance of the primary inductor is adjustable via magnetic coupling to the secondary inductor, and a frequency of the oscillating output signal is responsive to the effective inductance of the primary inductor and to the capacitance of the varactor.

24 Claims, 7 Drawing Sheets

(51) Int. Cl.
  *H03C 3/09*  (2006.01)
  *H03B 5/12*  (2006.01)
  *H03L 7/187*  (2006.01)
  *H03L 7/07*  (2006.01)
  *H03L 7/10*  (2006.01)

(56) References Cited

U.S. PATENT DOCUMENTS

| | | | |
|---|---|---|---|
| 6,661,267 B2 | 12/2003 | Walker et al. | |
| 6,763,228 B2 * | 7/2004 | Prentice et al. | 455/127.2 |
| 6,784,755 B2 * | 8/2004 | Lin et al. | 331/57 |
| 6,836,192 B1 * | 12/2004 | Yang et al. | 331/179 |
| 6,838,951 B1 | 1/2005 | Nieri et al. | |
| 7,053,723 B2 * | 5/2006 | Fredriksson | 331/135 |
| 7,342,464 B2 * | 3/2008 | Hino | 331/167 |
| 7,545,222 B2 | 6/2009 | Chou et al. | |
| 8,049,568 B2 | 11/2011 | Youssef et al. | |
| 8,154,351 B2 * | 4/2012 | Tadjpour | 331/25 |
| 2006/0098762 A1 | 5/2006 | Wojtiuk | |
| 2006/0232348 A1 * | 10/2006 | Hino | 331/167 |
| 2007/0146088 A1 | 6/2007 | Arai et al. | |
| 2008/0278250 A1 | 11/2008 | Hung et al. | |
| 2010/0238843 A1 | 9/2010 | Taghivand | |
| 2010/0277211 A1 | 11/2010 | Geng et al. | |
| 2011/0057736 A1 * | 3/2011 | Badillo | 331/57 |
| 2011/0133799 A1 | 6/2011 | Dunworth et al. | |
| 2011/0316515 A1 * | 12/2011 | Mitsuda et al. | 323/314 |

* cited by examiner

APPARATUS AND METHOD FOR GENERATING AN OSCILLATING OUTPUT SIGNAL

I. FIELD

The present disclosure is generally related to tuning an oscillator.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless computing devices may use a voltage-controlled oscillator (VCO) for transmission and reception of wireless signals. In conventional analog VCOs, a tuning voltage may be provided to a variable capacitance element (varactor) to fine-tune the VCO and to compensate for temperature variations. Although varactors typically have a non-linear tuning characteristic, phase modulation that requires relatively linear tuning may still be performed on conventional VCOs over relatively narrow bandwidths, such as for Global System for Mobile Communications (GSM) and/or Enhanced Data rates for GSM Evolution (EDGE) communications. However, such non-linearity may be prohibitive for phase modulation over larger bandwidths, such as wideband polar modulation for Wideband Code Division Multiple Access (WCDMA) communications.

In addition, sending digital wideband phase modulation data from a baseband (BB) integrated circuit to a radio frequency integrated circuit (RFIC) that includes a VCO may require a significant number of digital data pins (e.g. five or more pins) and digital circuitry on the RFIC, increasing a size and cost of the RFIC. Further, the digital circuitry and accompanying digital-to-analog converter(s) (DACs) on the RFIC increase noise at the RFIC, impacting wireless communication quality.

III. SUMMARY

Systems and methods to tune an oscillator are disclosed. An oscillator (e.g., a hybrid voltage and current controlled oscillator) may receive a tuning current and a tuning voltage over a wideband linear tuning range. The tuning voltage may be provided to a varactor within the oscillator for loop locking and to compensate for process, voltage, and temperate variations. After loop locking, the tuning current may be adjusted based on phase modulation data to obtain a substantially linear current gain at the oscillator.

In a particular embodiment, a method of generating an oscillating output signal includes providing a tuning current to a first input of an oscillator. The method further includes providing a tuning voltage to a second input of the oscillator. A frequency of the oscillator is independently responsive to the tuning current and to the tuning voltage.

In another particular embodiment, an apparatus for generating an oscillating output signal includes an inductive-capacitive (LC) circuit and a current tuning circuit. The LC circuit includes a primary inductor and a varactor coupled to the primary inductor. A capacitance of the varactor is responsive to a voltage at a control input of the varactor. The current tuning circuit includes a secondary inductor and a current driving circuit coupled to the secondary inductor. The current driving circuit is responsive to a current at a control input of the current driving circuit. An effective inductance of the primary inductor is adjustable via magnetic coupling to the secondary inductor and a frequency of the oscillating output signal is responsive to the effective inductance of the primary inductor and the capacitance of the varactor.

One particular advantage provided by at least one of the disclosed embodiments is an ability to tune an oscillator over a wide bandwidth while maintaining a substantially linear current gain at the oscillator over the bandwidth. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
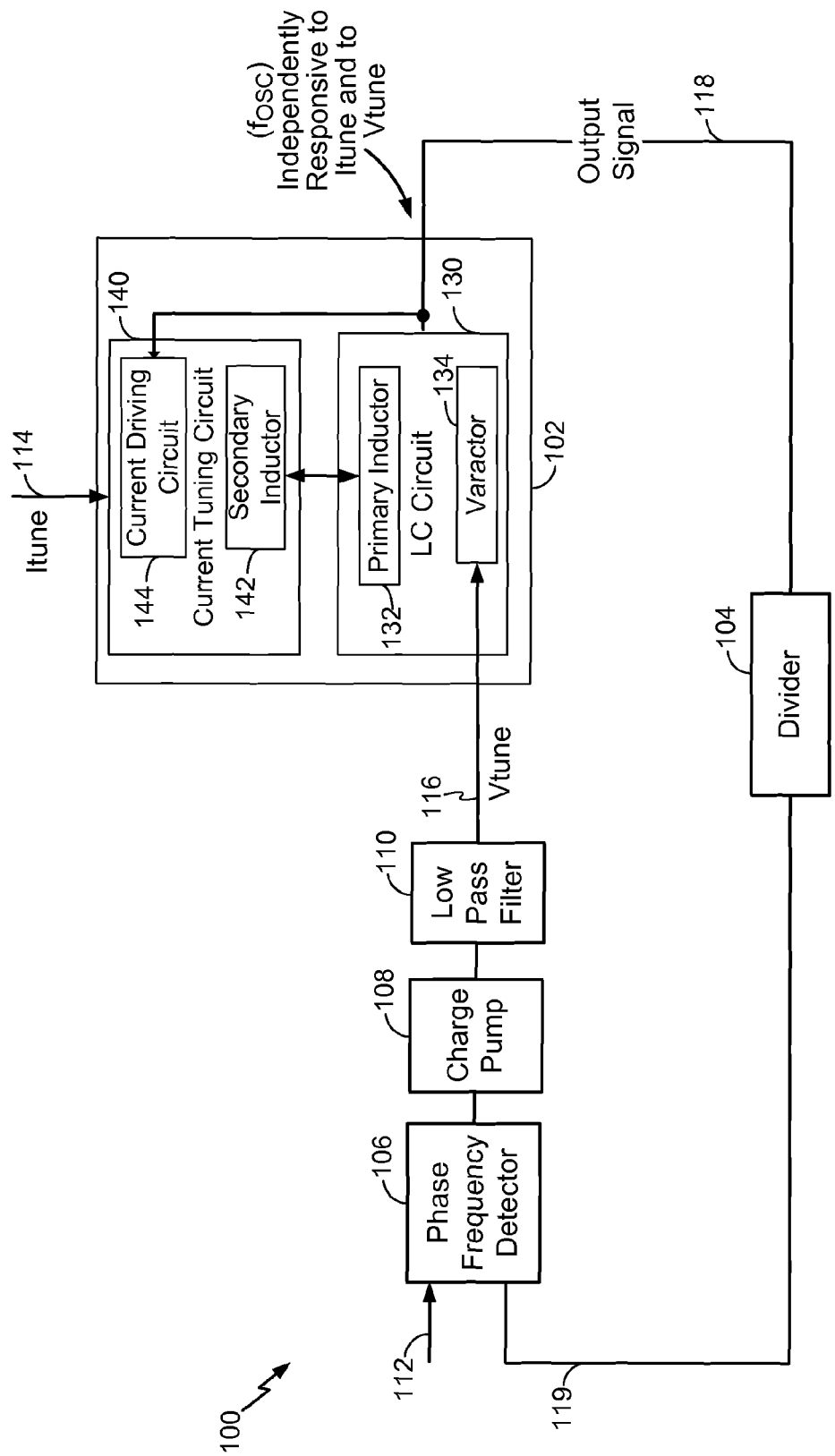
FIG. 1 is a block diagram of a particular illustrative embodiment of a system that is operable to tune an oscillator of an analog phase locked loop with a tuning voltage and a tuning current.

Referring to FIG. 1, a particular illustrative embodiment of a system 100 that is operable to tune an oscillator of an analog phase locked loop with a tuning voltage and a tuning current is shown. The system 100 includes an oscillator 102, a divider 104, a phase frequency detector 106, a charge pump 108, and a low pass filter 110. The oscillator 102, the divider 104, the phase frequency detector 106, the charge pump 108, and the low pass filter 110 may be included in an analog phase locked loop (PLL).

A reference signal 112 having a reference frequency ($f_{ref}$) is received at a first input of the phase frequency detector 106 and a feedback signal 119 of the analog PLL is received at a second input of the phase frequency detector 106. The phase frequency detector 106 is configured to provide a signal to the charge pump 108 based on a phase difference between the reference signal 112 and the feedback signal 119. The charge pump 108 is configured to generate a pre-filtered tuning voltage signal and to provide the pre-filtered tuning voltage signal to the low pass filter 110. The low pass filter 110 is configured to filter out high frequency components of the pre-filtered tuning voltage signal and to generate a tuning voltage 116 (e.g., a fine tuning signal to adjust a frequency of the oscillator 102 based on a difference between the phase of the reference signal 112 and a phase of the feedback signal 119). The low pass filter 110 provides the tuning voltage (Vtune) 116 to a second input of the oscillator 102. Thus, the tuning voltage 116 may be generated within the analog PLL.

The oscillator 102 is configured to receive the tuning voltage 116 and to receive a tuning current (Itune) 114. The oscillator 102 includes an inductive-capacitive (LC) circuit 130 and a current tuning circuit 140. The LC circuit 130 includes a primary inductor 132 and a varactor 134 coupled to the primary inductor 132. The current tuning circuit 140 includes a secondary inductor 142 and a current driving circuit 144 coupled to the secondary inductor 142.

The oscillator 102 may receive the tuning voltage 116 at the second input (i.e., a control input of the varactor 134) and may generate an output signal 118 having an oscillation frequency ($f_{OSC}$) in response to receiving the tuning voltage 116. In a particular embodiment, the second input of the oscillator 102 may be coupled to provide the tuning voltage 116 to a variable capacitance element within the oscillator 102, such as the varactor 134, to cover wide tuning ranges as described in further detail with respect to FIGS. 4 and 5. A capacitance of the varactor 134 may be responsive to a voltage (i.e., the tuning voltage 116) at the control input of the varactor 134. The output signal 118 is provided to the divider 104. The divider 104 is configured to divide the oscillation frequency ($f_{OSC}$) of the output signal 118 by a factor N to generate the feedback signal 119 having a feedback frequency ($f_{OSC}/N$). The tuning voltage 116 is adjusted until the frequency of the feedback signal 119 is equal to or approximately equal to the frequency of the reference signal 112 (e.g., $f_{ref}=f_{OSC}/N$). When the frequency of the feedback signal 119 is equal to or approximately equal to the frequency of the reference signal 112 (e.g., $f_{ref}=f_{OSC}/N$) and the average phase difference between the feedback signal and the reference signal 112 is approximately zero, the analog PLL is locked. The oscillator 102 may also receive the tuning current 114 at a first input (i.e., a control input of the current driving circuit 144). The current driving circuit 144 may be responsive to a current (i.e., the tuning current 114) at the control input of the current driving circuit 144.

The oscillator 102 may be a hybrid voltage and current controlled oscillator, and the oscillation frequency ($f_{OSC}$) may be independently responsive to the tuning voltage 116 provided to the control input of the varactor 134 and to the tuning current 114 provided to the control input of the current driving circuit 144. For example, the secondary inductor 142 may be inductively coupled to the primary inductor 132. An effective inductance of the primary inductor 132 may be adjustable via magnetic coupling to the secondary inductor 142. In a particular embodiment, the oscillation frequency ($f_{OSC}$) of the output signal 118 and the phase of the output signal 118 may be controlled by the tuning current 114 (i.e., inductive current tuning) while a substantially constant tuning voltage 116 is provided to the varactor 134 of the oscillator 102. For example, a change in the tuning current 114 may cause the current driving circuit 144 to change the amount of current across the secondary inductor 142. The current across the secondary inductor 142 and the current across the primary inductor 132 may cause the secondary inductor 142 to inductively couple with the primary inductor 132. Thus, a change in the amount of current across the secondary inductor 142 may change the effective inductance of the primary inductor 132, which in turn may change the oscillation frequency ($f_{OSC}$) of the output signal 118 because the oscillation frequency ($f_{OSC}$) is dependent at least in part on the effective inductance of the primary inductor 132. In an alternate embodiment, the oscillation frequency ($f_{OSC}$) of the output signal 118 and the phase of the output signal 118 may be controlled by the tuning voltage 114 (i.e., varactor voltage tuning) while a substantially constant tuning current 114 is provided to the current driving circuit 144 of the oscillator 102. For example, a change in the tuning voltage 116 may change the capacitance of the varactor 134. The capacitance of the varactor 134 may cause the LC circuit 130 to resonate, thus changing the oscillation frequency ($f_{OSC}$) of the output signal 118. Thus, a frequency of the output signal 118 (i.e., an oscillating output signal) may be responsive to the effective inductance of the primary inductor 132 and to the capacitance of the varactor 134. In some embodiments, one of the tuning current 114 and the tuning voltage 116 may have a zero value.

During operation, the tuning voltage 116 may be provided to the varactor 134 of the oscillator 102 to fine tune the oscillation frequency ($f_{OSC}$) of the output signal 118 to compensate for process, voltage, and temperature (PVT) variations, such as an increase or decrease in temperature. The oscillator 102 may be responsive to the tuning voltage 116 for loop locking of the analog PLL. For example, the tuning voltage 116 may be provided to the varactor 134 (i.e., a variable capacitor) of a resonant tank circuit (i.e., the LC circuit 130) within the oscillator 102, causing the resonant tank circuit to resonate at an oscillation frequency ($f_{OSC}$) (e.g., generating the output signal 118 having the oscillation frequency ($f_{OSC}$)).

When the analog PLL is locked (e.g., when the output signal 118 is locked to oscillate at the oscillation frequency ($f_{OSC}$)), the tuning current 114 provided to the current driving circuit 144 of the oscillator 102 may be adjusted to adjust a phase of the output signal 118. For example, the tuning current 114 may be provided (via the current driving circuit 114) to the secondary inductor 142 within the oscillator 102 that is magnetically coupled to the primary inductor 132 of the resonant tank circuit via a mutual inductance. As described with respect to FIGS. 2 and 3, a high pass modulation circuit of a baseband processor may generate phase modulation data that adjusts the tuning current 114 when provided to a digital-to-analog converter. As the tuning current 114 (flowing through the secondary inductor 142) is adjusted, the effective inductance of the primary inductor 132 may be adjusted in response to the magnetic coupling. Adjusting the effective inductance of the primary inductor 132 may vary the phase of the output signal 118 and may change the oscillation frequency ($f_{OSC}$) of the output signal 118, thus achieving phase modulation on the oscillator 102. To compensate for changes in the oscillation frequency ($f_{OSC}$), the tuning voltage 116 may be further adjusted to regulate the oscillation frequency ($f_{OSC}$) of the oscillator 102. For example, the tuning voltage 116 may maintain the average oscillation frequency ($f_{OSC}$) of the oscillator 102 at a substantially constant frequency. Thus, the phase of the oscillator 102 (i.e., the phase of the output signal 118) may be responsive to the tuning current 114 and the oscillation frequency ($f_{OSC}$) may be responsive to the tuning voltage 116.

It will be appreciated that the system 100 of FIG. 1 may tune the oscillator 102 to compensate for PVT variations and may reduce phase noise generated by tuning the oscillator 102. For example, increases in temperature may cause the oscillation frequency ($f_{OSC}$) of the output signal 118 to rise. To compensate, the oscillation frequency ($f_{OSC}$) may be adjusted by adjusting the tuning voltage 116 provided to the varactor within the oscillator 102. It will also be appreciated that the tuning voltage 116 may be adjusted to cover a different frequency band in a different mode of operation. The oscillator 102 may be tuned by coarse tuning with switched capacitors and fine tuning with a varactor. The tuning voltage 116 applied to the varactor may cover a frequency gap between two adjacent coarse tune steps.

Figure 2:
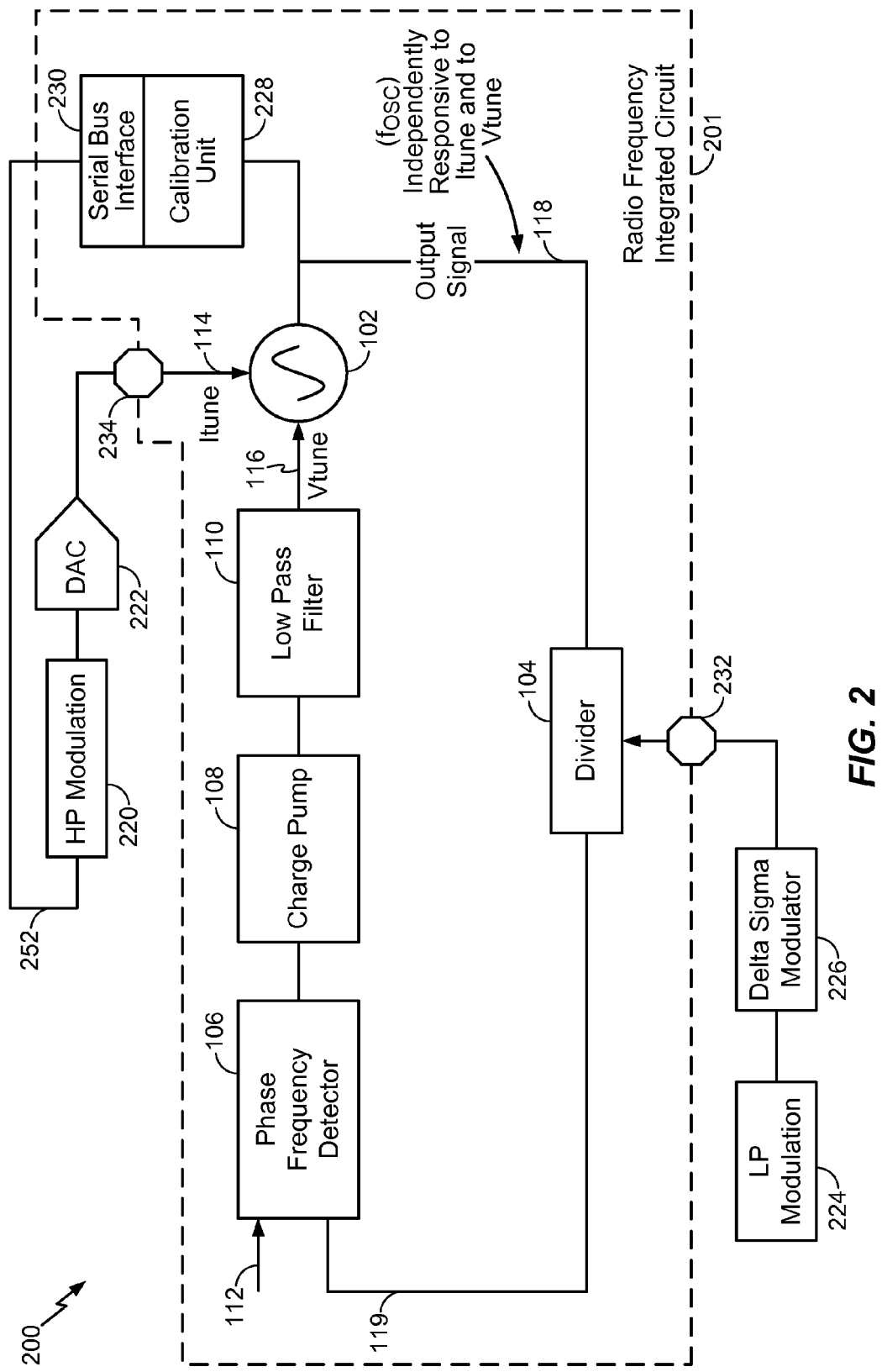
FIG. 2 is a block diagram of another particular illustrative embodiment of a system that is operable to tune the oscillator of FIG. 1 with a tuning voltage and a tuning current.

Referring to FIG. 2, a particular illustrative embodiment of a system 200 that is operable to tune the oscillator of FIG. 1 is shown. The system 200 includes the oscillator 102, the divider 104, the phase frequency detector 106, the charge pump 108, the low pass filter 110, a calibration unit 228, and a serial bus interface 230. As explained with respect to FIG. 1, the oscillator 102, the divider 104, the phase frequency detector 106, the charge pump 108, and the low pass filter 110 may be included in the analog PLL. The analog PLL, the calibration unit 228, and the serial bus interface 230 may be included in a radio frequency integrated circuit (RFIC) 201.

The system 200 further includes a high-pass (HP) modulation circuit 220, a first digital-to-analog converter (DAC) 222, a low-pass (LP) modulation circuit 224, and a delta sigma modulator 226. The HP modulation circuit 220, the first DAC 222, the LP modulation circuit 224, and the delta sigma modulator 226 may be included in a baseband processor. The baseband processor is configured to be reusable for different modes of operation. For example, the baseband processor may be used for narrow bandwidth operations (i.e., GSM/EDGE operations) and for wide bandwidth operations (i.e., wideband polar modulation for WCDMA operations).

During Cartesian modulation (I/Q modulation) operations, the first DAC 222 of the baseband processor may be used as part of an in-phase processing path (e.g., an in-phase transmission channel). During polar modulation operations, the first DAC 222 (i.e., an in-phase channel DAC) may be reused to provide the tuning current 114 to the oscillator 102. For example, during polar modulation operations, the calibration unit 228 is configured to determine a current gain ($K_{ICO}$) of the oscillator 102. As described with respect to FIG. 4, the current gain ($K_{ICO}$) may be represented as a change in oscillation frequency ($f_{OSC}$) divided by a change in the tuning current 114 (e.g., $K_{ICO} = \Delta f_{OSC}/\Delta I_{tune}$). The calibration unit 228 is further configured to provide a result of the current gain determination to the HP modulation circuit 220 via the serial bus interface 230. The result may be provided to the HP modulation circuit 220 via a control signal 252.

The HP modulation circuit 220 is configured to receive the control signal 252 corresponding to the current gain determination and to generate phase modulation data based on the control signal 252. For example, the phase modulation data may correspond to the oscillator current gain ($K_{ICO}$) from the calibration unit 228. The HP modulation circuit 220 may generate adjusted modulation data based on the oscillator current gain ($K_{ICO}$) and may send the adjusted modulation data to the DAC 222. The DAC 222 may generate a tuning current 114 (e.g., $\Delta I_{tune}$) that, when provided to the secondary inductor within the oscillator 102, changes the phase of the output signal 118. As described with respect to FIG. 1, the effective inductance of the primary inductor of the resonant tank circuit is responsive to the tuning current 114 based on the magnetic coupling of the primary inductor and the secondary inductor. The oscillation frequency ($f_{OSC}$) of the output signal 118 and the phase of the output signal 118 is responsive to the effective inductance of the primary inductor.

The HP modulation circuit 220 is further configured to provide the phase modulation data to the first DAC 222.

The first DAC 222 is configured to receive the phase modulation data and to generate the tuning current 114 based on the phase modulation data. Thus, the tuning current 114 may be responsive to the phase modulation data. The first DAC 222 is further configured to provide the tuning current 114 to the oscillator 102 so that the output signal 118 may be a phase modulated signal. For example, the first DAC 222 may provide the tuning current 114 to the first input of the oscillator 102 via a first data interface pin 234 (e.g., a transmitter quadrature baseband input pin (e.g., a first single analog pin) of the RFIC 201). The tuning current 114 may adjust the phase of the oscillator 102. For example, when the analog PLL is locked, the tuning current 114 may be provided to the secondary inductor within the oscillator 102 resulting in inductive current tuning for phase modulation. As explained with respect to FIG. 1, the tuning current 114 is provided to the secondary inductor (not shown) of the oscillator 102 that is magnetically coupled to the primary inductor of the resonant tank circuit via a mutual inductance. The high pass modulation circuit 220 generates phase modulation data that adjusts the tuning current 114 when provided to the first DAC 222. As the tuning current 114 is adjusted, the phase of the output signal 118 may change due to the magnetic coupling of the primary and secondary inductors while the tuning voltage 116 regulates the center frequency of the oscillator 102.

During Cartesian modulation operations, the first DAC 222 may operate as an in-phase channel DAC of the baseband processor to provide amplitude modulation data to the oscillator 102 via the first data interface pin 234. During polar modulation operations, the first DAC 222 may be re-tasked to provide a signal (i.e., the tuning current 114) to the oscillator 102 via the first data interface pin 234 for phase modulation of the output signal 118.

The LP modulation circuit 224 is configured to generate low pass modulation data and to provide the low pass modulation data to the delta sigma modulator 226. The delta sigma modulator 226 is configured to receive the low pass modulation data and to generate a low pass modulation signal (e.g., a two-bit signal) to the divider 104 via a second data interface pin 232 (e.g., a second single analog pin) of the RFIC 201. For example, the delta sigma modulator 226 may receive the low pass modulation data and control the division ratio (N) of the divider 104 via providing one of four levels to the divider 104, where each level corresponds to a different division ratio (N). The four levels can be represented by a two-bit binary data. In a particular embodiment, a two-bit low pass modulation signal may be serially transmitted to the divider 104 via the second data interface pin 232 by using a data transfer rate (e.g., 38.4 MHz) through the second data interface pin 234 that is at twice a typical clocking rate to communicate the two-bit signal in a time period corresponding to a single bit at the typical clocking rate. Thus, the output signal 118 may be generated at the output of the oscillator 102 based on a two point modulation (TPM) input (e.g., a high pass modulation data input corresponding to the HP modulation circuit 220 and a low pass modulation data input corresponding to the LP modulation circuit 224).

During operation, the tuning voltage 116 may be provided to a variable capacitance element within the oscillator 102 (i.e., the hybrid voltage and current controlled oscillator) for loop locking and to compensate for PVT variations during a wideband operation, such as wideband polar modulation for WCDMA communications. For example, the tuning voltage 116 may tune the oscillator 102 to an oscillation frequency ($f_{OSC}$) to compensate for temperature increases during operation. The tuning current 114 may be provided to the secondary inductor within the oscillator 102 for inductive current tuning to perform phase modulation while having substantially linear tuning characteristics (i.e., ±2% linearity over 32 MHz).

The calibration unit 228 determines the current gain ($K_{ICO}$) of the oscillator 102 and sends the results of the current gain determination to the baseband processor. For example, the calibration unit 228 of the RFIC 201 may determine the current gain ($K_{ICO}$) of the oscillator 102 based on the change in tuning current 114 (e.g., $\Delta I_{tune}$) and the oscillation frequency ($f_{OSC}$) (e.g., $K_{ICO} = \Delta f_{OSC}/\Delta I_{tune}$). The calibration unit 228 may provide the result of the current gain determination to the HP modulation circuit 220 via the serial bus interface 230. The HP modulation circuit 220 generates and provides high pass modulation data to the first DAC 222 to adjust the tuning current 114 to generate a substantially constant current gain ($K_{ICO}$).

It will be appreciated that the system 200 of FIG. 2 may reduce power consumption in addition to saving die area and reducing pin count. For example, the first DAC 222 of the baseband processor may be reused for GSM/EDGE operations and for WCDMA operations. Reusing the first DAC 222 to provide the tuning current 114 to the oscillator 102 for inductive current tuning may save die area as compared to having a DAC for providing the tuning current 114 and a separate DAC for in-phase processing of baseband signals. Reusing the first DAC 222 of the baseband processor may also save die area of the RFIC 201 by reducing or eliminating the need for the RFIC 201 to include a DAC for the oscillator 102. Further, reusing the first data interface pin 234 to provide the tuning current 114 to the oscillator 102 may reduce the number of pins needed to provide the tuning current 114 to the oscillator 102. It will also be appreciated that a single pin (i.e., the second data interface pin 232) may replace multiple pins (e.g., three digital pins) that would otherwise be used to provide the low pass modulation data to the divider 104.

Figure 3:
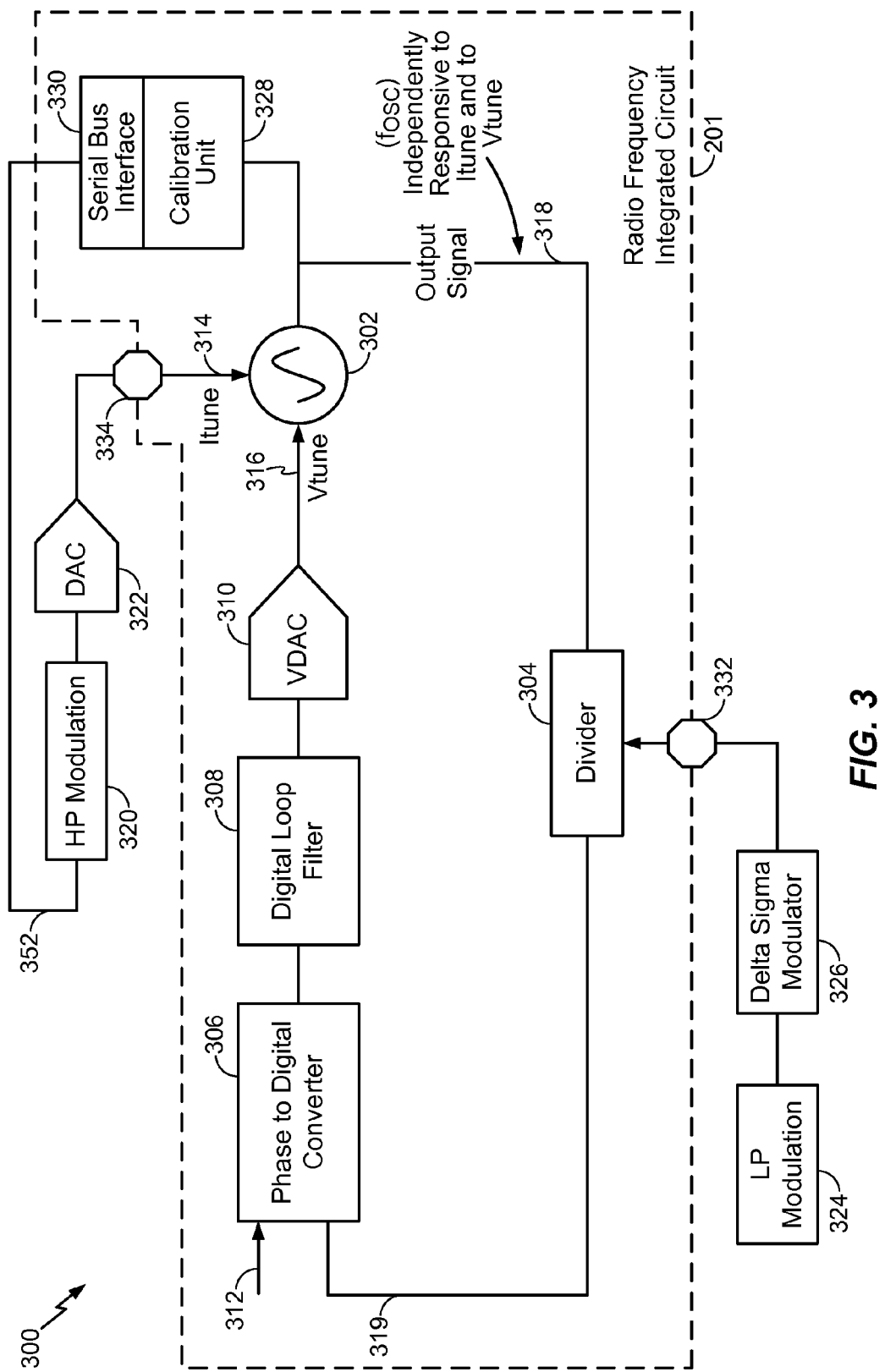
FIG. 3 is a block diagram of another particular illustrative embodiment of a system that is operable to tune an oscillator of a digital phase locked loop with a tuning voltage and a tuning current.

Referring to FIG. 3, a particular illustrative embodiment of a system 300 that is operable to tune an oscillator of a digital phase locked loop with a tuning voltage and a tuning current is shown. The system 300 includes an oscillator 302, a divider 304, a phase to digital converter 306, a digital loop filter 308, and a voltage digital-to-analog converter (DAC) 310. The oscillator 302, the divider 304, the phase to digital converter 306, the digital loop filter 308, and the voltage DAC 310 may be included in a digital phase locked loop (DPLL).

The system 300 further includes a high-pass (HP) modulation circuit 320, a first DAC 322, a low-pass (LP) modulation circuit 324, and a delta sigma modulator 326. The HP modulation circuit 320, the first DAC 322, the LP modulation circuit 324, and the delta sigma modulator 326 may be included in a baseband processor. The baseband processor is configured to be reusable for different modes of operations. For example, the baseband processor may be used for narrow bandwidth operations (i.e., GSM/EDGE operations) and for wide bandwidth operations (i.e., wideband polar modulation for WCDMA operations). During Cartesian modulation operations, the baseband processor (e.g., the first DAC 322) may be used as an in-phase transmission channel. During polar modulation operations, the baseband processor may be used to adjust/generate a tuning current 314 that is provided to the oscillator 302 based on phase modulation data.

A reference signal 312 is provided to a first input of the phase to digital converter 306 and a feedback signal 319 of the DPLL is provided to a second input of the phase to digital converter 306. The phase to digital converter 306 is configured to generate and provide a digital signal to the digital loop filter 308 corresponding to a difference in phase between the reference signal 312 and the feedback signal 319. The digital loop filter 308 is configured to filter high frequency components of the digital signal and to provide a filtered signal to the voltage DAC 310. The voltage DAC 310 is configured to generate a tuning voltage 316 that is provided to a second input of the oscillator 302. Thus, the tuning voltage 316 may be generated within the DPLL.

The oscillator 302 is configured to receive the tuning voltage 316 at the second input and to generate an output signal 318 having an oscillation frequency ($f_{OSC}$) in response to receiving the tuning voltage 316. In a particular embodiment, the second input of the oscillator 302 may be coupled to provide the tuning voltage 316 to a variable capacitance element within the oscillator 302, such as a varactor, to cover wide tuning ranges. The output signal 318 is provided to the divider 304. The divider 304 is configured to divide the oscillation frequency ($f_{OSC}$) of the output signal 318 by a factor N to generate the feedback signal 319 having a feedback frequency ($f_{OSC}/N$). The tuning voltage 316 is adjusted until the frequency of the feedback signal 319 is equal to or approximately equal to the frequency of the reference signal 312 (e.g., $f_{ref} = f_{OSC}/N$). When the frequency of the feedback signal 319 is equal to or approximately equal to the frequency of the reference signal 312 (e.g., $f_{ref} = f_{OSC}/N$) and the average phase difference between the feedback signal 319 and the reference signal 312 is approximately zero, the DPLL is locked. The oscillator 302 is further configured to receive a tuning current 314 at a first input. For example, the oscillator 302 may be a hybrid voltage and current controlled oscillator and the oscillation frequency ($f_{OSC}$) may be independently responsive to the tuning voltage 316 and to the tuning current 314.

During Cartesian modulation operations, the first DAC 322 of the baseband processor may be used as part of an in-phase processing path (e.g., an in-phase transmission channel). During polar modulation operations, the first DAC 322 (i.e., an in-phase channel DAC) may be reused to provide the tuning current 314 to the oscillator 302. For example, during polar modulation operations, the calibration unit 328 is configured to determine a current gain ($K_{ICO}$) of the oscillator 302. As described with respect to FIG. 4, the current gain ($K_{ICO}$) may be represented as a change in oscillation frequency ($f_{OSC}$) divided by a change in the tuning current 314 (e.g., $K_{ICO} = \Delta f_{OSC}/\Delta I_{tune}$). The calibration unit 328 is further configured to provide a result of the current gain determination to the HP modulation circuit 320 via the serial bus interface 330. The calibration result may be provided to the HP modulation circuit 320 via a control signal 352.

The HP modulation circuit 320 is configured to receive the control signal 352 corresponding to the current gain determination and to generate phase modulation data based on the control signal 352. The phase modulation data may correspond to a change in tuning current 314 (e.g., $\Delta I_{tune}$) that, when provided to a secondary inductor (not shown) within the oscillator 302, changes the phase of the output signal 318. For example, the oscillator 302 may include a resonant tank circuit (not shown) that includes a variable capacitance element and a primary inductor. The secondary inductor may be magnetically coupled to the primary inductor of the resonant tank circuit via a mutual inductance. As the tuning current 314 (flowing through the secondary inductor) is adjusted, an effective inductance of the primary inductor may be adjusted in response to the magnetic coupling. Adjusting the effective inductance of the primary inductor may vary the phase of the output signal 318 and may vary the oscillation frequency ($f_{OSC}$) of the output signal 318. The HP modulation circuit 320 is further configured to provide the phase modulation data to the first DAC 322.

The first DAC 322 is configured to receive the phase modulation data and to generate the tuning current 314 based on the phase modulation data. Thus, the tuning current 314 may be responsive to the phase modulation data. The first DAC 322 is further configured to provide the tuning current 314 to the oscillator 302. For example, the first DAC 322 may provide the tuning current 314 to the first input of the oscillator 302 via a first data interface pin 334 (e.g., a transmitter quadrature baseband input pin (e.g., a first single analog pin) of the RFIC 301). The tuning current 314 may adjust the phase of the oscillator 302. As explained above, when the DPLL is locked, the tuning current 314 may be provided to the secondary inductor within the oscillator 302 resulting in inductive current tuning for phase modulation. To compensate for the changes in the oscillation frequency ($f_{OSC}$) that may result from adjusting the tuning current 314, the tuning voltage 316 may be further adjusted to regulate (e.g., maintain) the average oscillation frequency ($f_{OSC}$) at a substantially constant frequency level.

In a particular embodiment, an in-phase channel DAC of the baseband processor may be reused to provide amplitude modulation data to the oscillator 302. For example, during Cartesian modulation operations, the in-phase channel DAC may provide a signal to the oscillator 302 via the first data interface pin 334 to adjust the amplitude of the output signal 318 (e.g., an amplitude modulated signal).

The LP modulation circuit 324 is configured to generate low pass modulation data and to provide the low pass modulation data to the delta sigma modulator 326. The delta sigma modulator 326 is configured to receive the low pass modulation data and to generate a low pass modulation signal (e.g., a two-bit signal) to the divider 304 via a second data interface pin 332 (i.e., a second single analog pin) of the RFIC 301. For example, the delta sigma modulator 326 may receive the low pass modulation data and control the division ratio (N) of the divider 304 via providing one of four levels to the divider 304, where each level corresponds to a different division ratio (N). The four levels can be represented by a two-bit binary data. In a particular embodiment, a two-bit low pass modulation signal may be serially transmitted to the divider 304 via the second data interface pin 332 by using a data transfer rate through the second data interface pin 332 that is at twice a typical clocking rate to communicate the two-bit signal in a time period corresponding to a single bit at the typical clocking rate. Thus, the output signal 318 may be generated at the output of the oscillator 302 based on a two point modulation (TPM) input (e.g., a high pass modulation data input corresponding to the HP modulation circuit 320 and a low pass modulation data input corresponding to the LP modulation circuit 324).

During operation, the tuning voltage 316 may be provided to a variable capacitance element within the oscillator 302 (i.e., the hybrid voltage and current controlled oscillator) for loop locking and to compensate for PVT variations during a wideband operation, such as wideband polar modulation for WCDMA communications. For example, the tuning voltage 316 may tune the oscillator 302 to an oscillation frequency ($f_{OSC}$) to compensate for temperature increases during operation. The tuning current 314 may be provided to the secondary inductor within the oscillator 302 for inductive current tuning to perform phase modulation while having substantially linear tuning characteristics (i.e., ±2% linearity over 32 MHz).

The calibration unit 328 determines the current gain ($K_{ICO}$) of the oscillator 302 and sends the results of the current gain determination to the baseband processor. For example, the calibration unit 328 of the RFIC 301 may determine the current gain ($K_{ICO}$) of the oscillator 302 based on the change in tuning current 314 (e.g., $\Delta I_{tune}$) and the oscillation frequency ($f_{OSC}$) (e.g., $K_{ICO} = \Delta f_{OSC}/\Delta I_{tune}$). The calibration unit 328 may provide the result of the current gain determination to the HP modulation circuit 320 via the serial bus interface 330. The HP modulation circuit 320 generates and provides high pass modulation data to the first DAC 322 to adjust the tuning current 314 to generate a substantially constant current gain ($K_{ICO}$).

It will be appreciated that the system 300 of FIG. 3 may reduce power consumption in addition to saving die area and reducing pin count. For example, the first DAC 322 of the baseband processor may be reused for GSM/EDGE operations and for WCDMA operations. Reusing the first DAC 322 to provide the tuning current 314 to the oscillator 302 for inductive current tuning may save die area as compared to having a DAC for providing the tuning current 314 and a separate DAC for in-phase processing of baseband signals. Further, reusing the first data interface pin 334 to provide the tuning current 314 to the oscillator 302 may reduce the number of pins needed to provide the tuning current 314 to the oscillator 302. It will also be appreciated that a single pin (i.e., the second data interface pin 332) may replace multiple pins (e.g., three digital pins) that would otherwise be used to provide the low pass modulation data to the divider 304.

Figure 4:
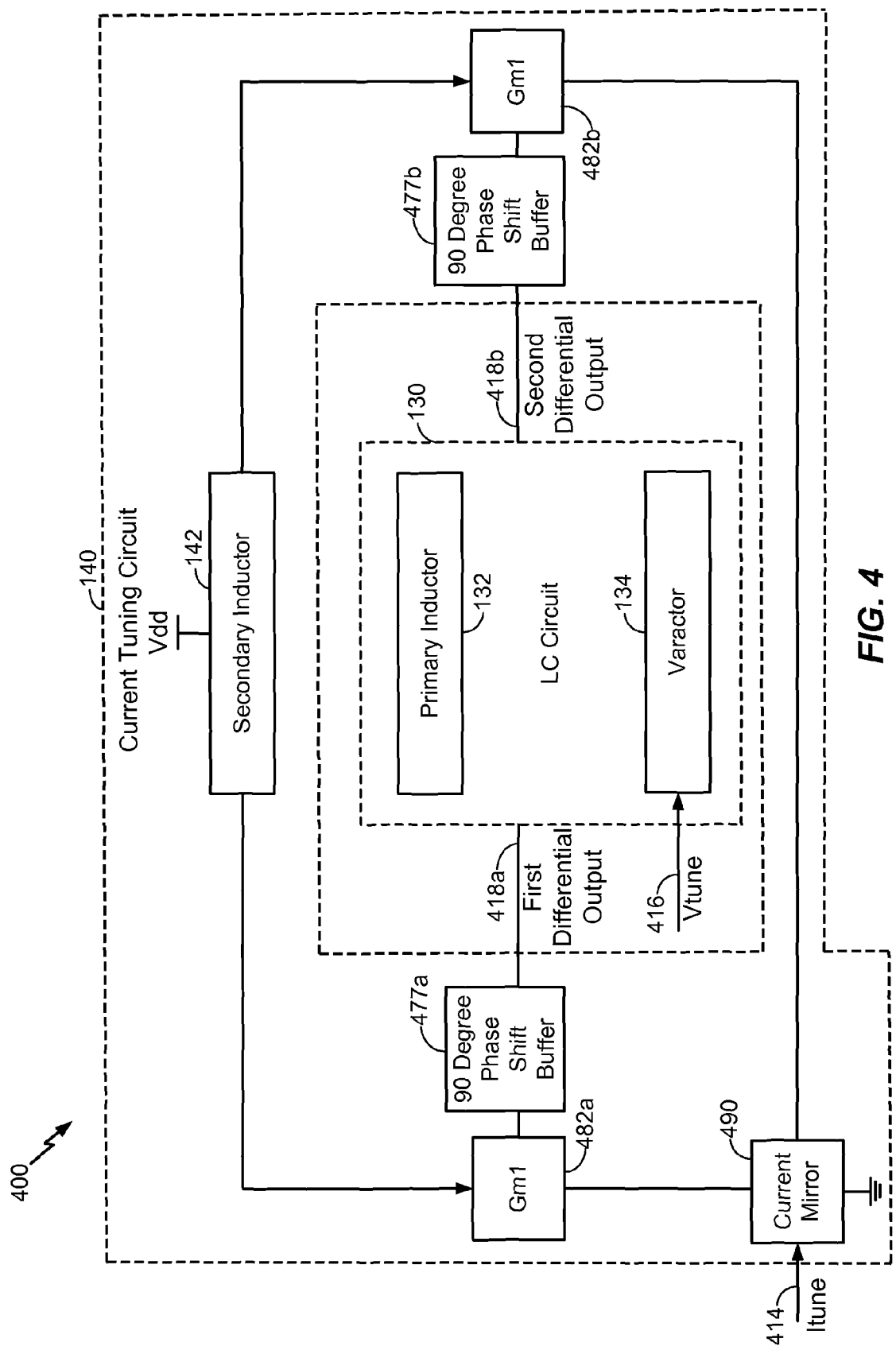
FIG. 4 is a block diagram of a particular illustrative embodiment of an oscillator that is responsive to a tuning voltage and a tuning current.

Referring to FIG. 4, a particular illustrative embodiment of an oscillator 400 that is operable to receive a tuning voltage and a tuning current is shown. The oscillator 400 may correspond to the oscillator 102 of FIGS. 1-2 or the oscillator 302 of FIG. 3 and may be a hybrid voltage and current controlled oscillator. For example, a frequency of the oscillator 400 may be independently responsive to a tuning current 414 and to a tuning voltage 416. The tuning current 414 may correspond to the tuning current 114 of FIGS. 1-2 or the tuning current 314 of FIG. 3. The tuning voltage 416 may correspond to the tuning voltage 116 of FIGS. 1-2 or the tuning voltage 316 of FIG. 3.

The oscillator 400 includes the LC circuit 130 and the current tuning circuit 140. The LC circuit 130 includes the varactor 134 and the primary inductor 132. The current tuning circuit 140 includes the secondary inductor 142. The current tuning circuit 140 further includes a first 90 degree phase shift buffer 477a, a second 90 degree phase shift buffer 477b, a first transconductor (Gm1) 482a, a second transconductor (Gm2) 482b, and a current mirror 490. In a particular embodiment, the current driving circuit 144 of FIG. 1 may include the first 90 degree phase shift buffer 477a, the second 90 degree phase shift buffer 477b, the first transconductor (Gm1) 482a, the second transconductor (Gm2) 482b, and the current mirror 490.

The oscillator 400 may receive the tuning voltage 416 at a control input of the varactor 134 and may generate a first differential output signal 418a and a second differential output signal 418b in response to receiving the tuning voltage 416. The first differential output signal 418a and the second differential output signal 418b may have an oscillation frequency ($f_{OSC}$). The first and second differential output signals 418a, 418b may correspond to the output signal 118 of FIGS. 1-2 or the output signal 318 of FIG. 3. A capacitance of the varactor 134 may be responsive to the tuning voltage 416 at the control input of the varactor 134. For example, as the tuning voltage 416 increases, the capacitance of the varactor 134 may cause the LC circuit 130 to resonate at a higher frequency which may increase the oscillation frequency ($f_{OSC}$) of the differential output signals 418a, 418b. Increasing the oscillation frequency ($f_{OSC}$) of the differential output signals 418a, 418b may change the effective tuning range (i.e., widen the tuning range) of a phased-locked loop (PLL), such as the PLLs illustrated in FIGS. 1-3. For example, the differential output signals 418a, 418b may be provided to the divider 104 of FIGS. 1-2 or to the divider 304 of FIG. 3.

The first differential output signal 418a may also be provided to the first 90 degree phase shift buffer 477a, and the second differential output signal 418b may also be provided to the second 90 degree phase shift buffer 477b. The 90 degree phase shift buffers 477a, 477b may selectively shift the differential output signals 418a, 418b by 90 degrees to align a phase of the currents flowing through the primary inductor 132 and the secondary inductor 142. For example, the 90 degree phase shift buffers 477a, 477b offset one another to correspond to a phase shift between current flowing through the primary inductor 132 and the current flowing through the secondary inductor 142.

The current mirror 490 may mirror the tuning current 414 to the first and second transconductors 482a, 482b. The first 90 degree phase shift buffer 477a may selectively activate the first transconductor (Gm1) 482a to provide the tuning current 414 to the secondary inductor 142 and the second 90 degree phase shift buffer 477b may selectively activate the second transconductor (Gm2) 482b to provide the mirrored current to the secondary inductor 142. For example, when the first differential output signal 418a has a logical high level (and the second differential output signal 418b has a logical low level), the first 90 degree phase shift buffer 477a activates the first transconductor (Gm1) 482a, and the first transconductor (Gm1) 482a provides the mirrored current to the secondary inductor 142 in a manner as to align the phase of the current flowing through the primary inductor 132 with the phase of the mirrored current flowing through the secondary inductor 142. Meanwhile, the second 90 degree phase shift buffer 477b deactivates the second transconductor (Gm2) 482b. As another example, when the second differential output signal 418b has a logical high level (and the first differential output signal 418a has a logical low level), the second 90 degree phase shift buffer 477b activates the second transconductor (Gm2) 482b, and the second transconductor (Gm2) 482b provides the mirrored current to the secondary inductor 142 in a manner as to align the phase of the current flowing through the primary inductor 132 with the phase of the mirrored current flowing through the secondary inductor 142. Meanwhile, the first 90 degree phase shift buffer 477a deactivates the first transconductor (Gm1) 482a.

The secondary inductor 142 may be coupled to a power supply (Vdd) via a center tap and may be inductively coupled to the primary inductor 130. An effective inductance of the primary inductor 132 may be adjustable via magnetic coupling to the secondary inductor 142. A change in the mirrored current across the secondary inductor 142 may be inductively coupled with current across the primary inductor 132 and may change the effective inductance of the primary inductor 132, thus changing the oscillation frequency ($f_{OSC}$) of the differential output signals 418a, 418b. Thus, the oscillation frequency ($f_{OSC}$) of the differential output signals 418a, 418b may be independently responsive to the tuning voltage 416 provided to the control input of the varactor 134 and independently responsive to the tuning current 414. As explained above, the tuning current 414 may be provided to the current tuning circuit 140 (i.e., to the current mirror 490 of the current tuning circuit 140) via a baseband processor, such as the baseband processor of FIG. 2 or the baseband processor of FIG. 3.

It will be appreciated that the oscillator 400 of FIG. 4 may be tunable using a varactor voltage for loop locking and to compensate for process, voltage, and temperature (PVT) variations using varactor voltage tuning. For example, providing the tuning voltage 416 to the variable capacitance element 134 may tune the oscillator 400 for varying PVT conditions.

Figure 5:
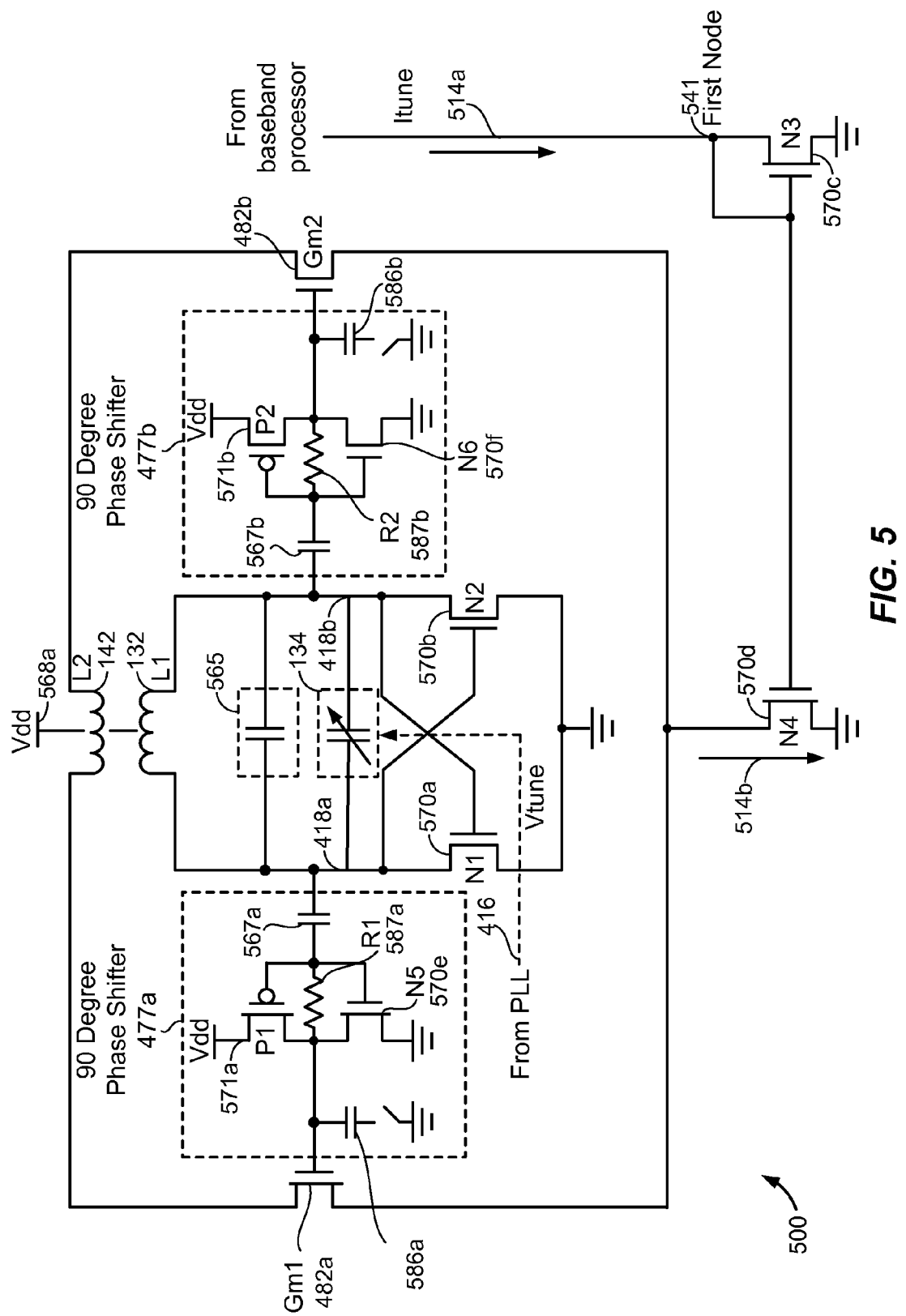
FIG. 5 is a circuit diagram of a particular illustrative embodiment of the oscillator of FIG. 4.

Referring to FIG. 5, a particular illustrative embodiment of an oscillator 500 that is operable to receive a tuning voltage and a tuning current is shown. The oscillator 500 may correspond to the oscillator 102 of FIGS. 1-2, the oscillator 302 of FIG. 3, or the oscillator 400 of FIG. 4, and may be a hybrid voltage and current controlled oscillator. For example, a frequency of the oscillator 500 may be independently responsive to a tuning current 514a, a mirrored current 514b and to the tuning voltage 416. The tuning current 514a and the mirrored current 514b may correspond to the tuning current 114 of FIGS. 1-2, the tuning current 314 of FIG. 3, or the tuning current 414 of FIG. 4.

A core of the oscillator 500 may include a first n-type metal oxide semiconductor (NMOS) transistor (N1) 570a, a second NMOS transistor (N2) 570b, a variable capacitance element 134 (i.e., a varactor), a capacitor bank 565, and the primary inductor (L1) 132. A source of the first NMOS transistor (N1) 570a may be coupled to ground and a drain of the first NMOS transistor (N1) 570a may be coupled to the first differential output 418a of the oscillator 500 core. A source of the second NMOS transistor (N2) 570b may be coupled to ground and a drain of the second NMOS transistor (N2) 570b may be coupled to the second differential output 418b of the oscillator 500 core. A gate of the first NMOS transistor (N1) 570a may be coupled to the second differential output 418b and a gate of the second NMOS transistor (N2) 570b may be coupled to the first differential output 418a. The first differential output 418a may be coupled to a first terminal of the primary inductor (L1) 132 and the second differential output 418b may be coupled to a second terminal of the primary inductor (L1) 132.

The oscillator 500 core may also include an inductor/capacitor (LC) tank. The LC tank includes the primary inductor (L1) 132 and the capacitor bank 565 (e.g., a bank of switched capacitors) coupled in a resonant circuit configured to generate an oscillating signal (having an oscillation frequency ($f_{OSC}$)) at the differential outputs 418a-b. The oscillating signal may correspond to the output signal 118 of FIGS. 1-2, the output signal 318 of FIG. 3, or any combination thereof. The LC tank may connect to the first differential output 418a and to the second differential output 418b. A variable capacitance element 134 (i.e., a varactor) is coupled to the first differential output 418a and to the second differential output 418b for varactor voltage tuning. A tuning voltage 416 from a phase lock loop may be provided to the variable capacitance element 134. For example, in a particular embodiment, the tuning voltage 416 may correspond to the tuning voltage 116 of FIGS. 1-2 and the oscillator 500 may correspond to the oscillator 102 of FIGS. 1-2. In an alternate embodiment, the tuning voltage 416 may correspond to the tuning voltage 316 of FIG. 3 and the oscillator 500 may correspond to the oscillator 302 of FIG. 3.

Current across the secondary inductor (L2) 142 (e.g., the mirrored current 514b) and current across the primary inductor (L1) 132 may cause the secondary inductor (L2) 142 to inductively couple with the primary inductor (L1) 132. The inductive coupling of the secondary inductor (L2) 142 and the primary inductor (L1) 132 may change the effective inductance of the primary inductor (L1) 132, thus changing the oscillation frequency ($f_{OSC}$) of the oscillating signal. For example, the primary inductor (L1) 132 may be inductively coupled with the secondary inductor (L2) 142 with a mutual inductance. A center tap from the primary inductor (L1) 132 may be coupled to a regulated supply voltage (Vdd) 568a, and a center tap from the secondary inductor (L2) 142 may be coupled to the regulated supply voltage (Vdd) 568a. In a particular embodiment, the mirrored current 514b may correspond to the tuning current 114 of FIGS. 1-2. In an alternate embodiment, the mirrored current 514b may correspond to the tuning current 314 of FIG. 3. For example, a tuning current 514a may be received at a first node 541 (e.g., a drain node) of a third NMOS transistor (N3) 570c. For example, in a particular embodiment, the tuning current 514a may correspond to the tuning current 114 of FIG. 2 and may be received from the first DAC 222 via the first data interface pin 234. In an alternate embodiment, the tuning current 514a may correspond to the tuning current 314 of FIG. 3 and may be received from the first DAC 322 via the first data interface pin 334. The tuning current 514a may be mirrored via a fourth NMOS transistor (N4) 570d to generate the mirrored current 514b sourced to the pair of transconductors (Gm1) 482a, (Gm2) 482b.

The first 90 degree phase shift buffer 477a may receive the first differential output 418a and the second 90 degree phase shift buffer 477b may receive the second differential output 418b. The 90 degree phase shift buffers 477a, 477b may selectively shift the differential outputs 418a, 418b by 90 degrees to align a phase of the currents flowing through the primary inductor (L1) 132 and the secondary inductor (L2) 142. The 90 degree phase shift buffers 477a, 477b may also perform noise reverse isolation and current gain ($K_{ICO}$) compensation with programmable shunt capacitor banks 586a, 586b. The programmable shunt capacitor banks 586a, 586b may be switched using, for example, 3 bit control signals (not shown).

In the 90 degree phase shift buffers 477a, 477b, a first capacitor 567a and a second capacitor 567b may be serially coupled with a first resistor (R1) 587a and a second resistor (R2) 587b, respectively, to phase shift the differential outputs 418a, 418b. A gate of a first p-type metal oxide semiconductor (PMOS) transistor (P1) 571a and a gate of a second PMOS transistor (P2) 571b may be coupled to a gate of a fifth NMOS transistor (N5) 570e and a gate of a sixth NMOS transistor (N6) 570f, respectively, to invert and buffer the phase-shifted differential outputs 418a, 418b and to isolate the oscillator 500 core from the pair of transconductors (Gm1) 482a, (Gm2) 482b. The 90 degree phase shift buffers 477a, 477b offset one another to correspond to a phase shift between current flowing through the primary inductor (L1) 132 and current (i.e., the mirrored current 514b) flowing through the secondary inductor (L2) 142.

The pair of transconductors (Gm1) 482a, (Gm2) 482b may be controlled by the mirrored current 514b. The mirrored current 514b may be a drain bias current of the fourth NMOS transistor (N4) 570d. The mirrored current 514b may be a sum of a source current of the first transconductor (Gm1) 482a and a source current of the second transconductor (Gm2) 482b. Therefore, the mirrored current 514b may be the bias current of the first transconductor (Gm1) 482a and the second transconductor (Gm2) 482b. For example, the mirrored current 514b may fully toggle between the first and second transconductors 482a-b and the linearity of the current gain ($K_{ICO}$) of the oscillator 500 may be independent on the mirrored current 514b and the transconductance (Gm1, Gm2), resulting in substantially linear oscillator current gain ($K_{ICO}$).

In a particular embodiment, the tuning current 514 may correspond to the tuning current 114, 314 of FIGS. 2 and 3, respectively, and may be responsive to the high pass modulation circuits 220, 320 of FIG. 2. Changing the tuning current 514a via the high pass modulation circuits 220, 320 of FIGS. 2 and 3 may change the mirrored current 514b through the secondary inductor (L2) 142, thus tuning the effective primary inductance (L1) 132, changing the oscillation frequency ($f_{OSC}$) of the oscillating signal, and changing the phase of the oscillating signal. The tuning voltage 416 may be further adjusted to regulate (i.e., maintain) the average oscillation frequency ($f_{OSC}$) at a substantially constant level in response to changes that may occur based on the tuning current 514b.

It will be appreciated that the oscillator 500 of FIG. 5 may be tunable using a varactor voltage for loop locking and to compensate for PVT variations using varactor voltage tuning. For example, providing the tuning voltage 416 to the variable capacitance element 134 may tune the oscillator 500 for varying PVT conditions. It will also be appreciated that the varactor voltage tuning may accomplish tuning over a wide coverage for wideband operations, such as wideband polar modulation for WCDMA communications where linearity may not be required. For example, the tuning voltage 416 provided to the variable capacitance element 134 may be adjusted so that output signals at the first and second differential outputs 418a, 418b may be tuned to a center frequency ($f_C$) over a wideband operation.

Figure 6:
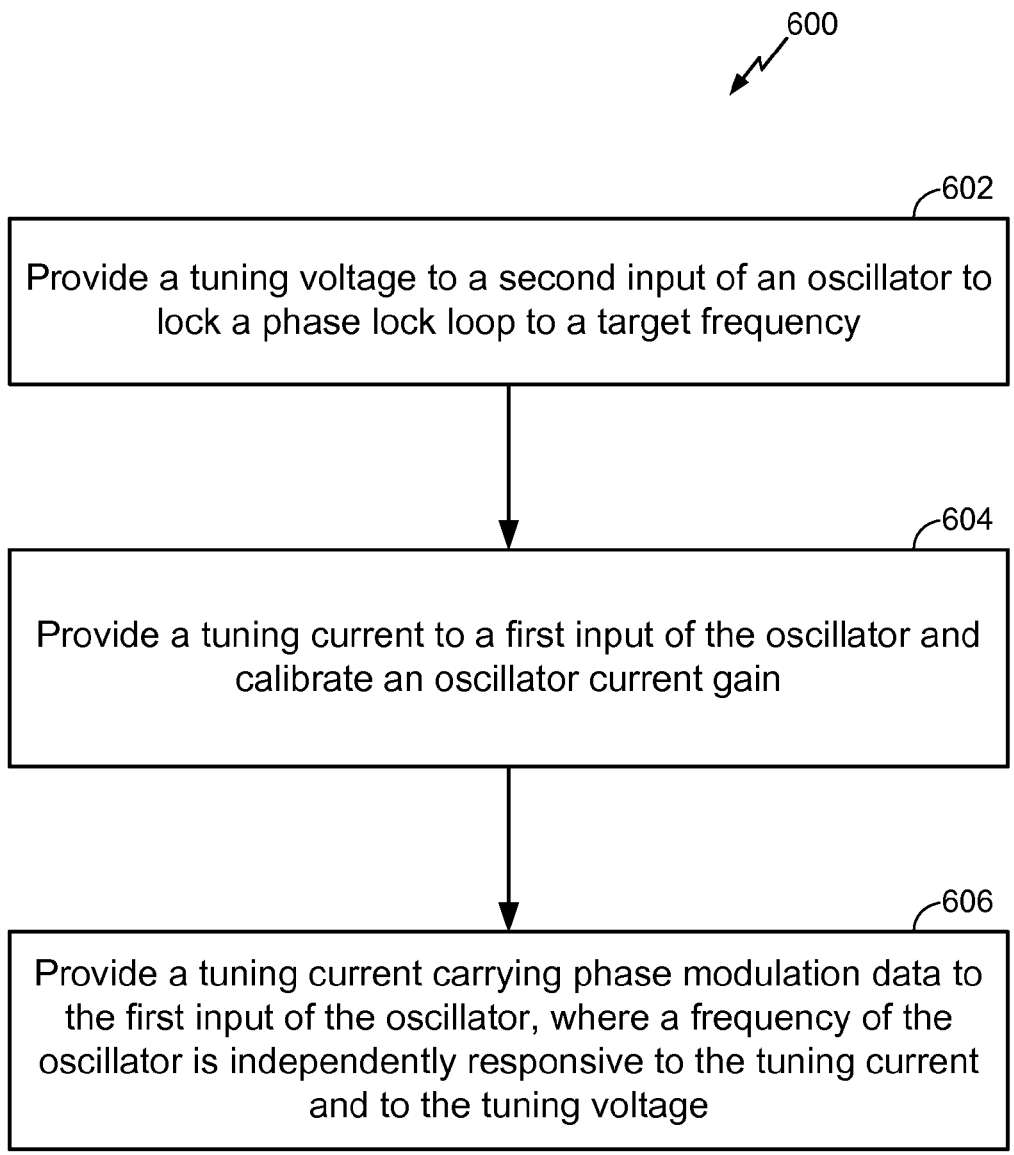
FIG. 6 is a flowchart to illustrate a particular embodiment of a method of generating an oscillating signal.

Referring to FIG. 6, a flowchart of a particular embodiment of a method 600 of generating an oscillating signal is shown. In an illustrative embodiment, the method 600 may be performed using the systems 100-300 of FIGS. 1-3, the oscillators 400-500 of FIGS. 4-5, or any combination thereof.

The method 600 may include providing a tuning voltage to a second input of an oscillator to lock a phase lock loop to a target frequency, at 602. For example, in FIG. 1, the tuning voltage 116 may be provided to the second input of the oscillator 102 to lock the oscillation frequency ($f_{OSC}$) of the output signal 118 (i.e., lock the phase lock loop) to a target frequency.

A tuning current may be provided to a first input of the oscillator and an oscillator current gain may be calibrated, at 604. For example, in FIG. 1, the tuning current 114 may be provided to the first input of the oscillator 102. In a particular embodiment, as described with respect to FIG. 2, the tuning current 114 may be provided to the oscillator 102 by the first DAC 222 of the baseband processor via a first data interface pin 234 (e.g., a single pin) during wideband operations, such as wideband polar modulation for WCDMA communications. The tuning current 114 may be used to calibrate the current gain ($K_{ICO}$) of the oscillator 102. For example, the calibration unit 228 determines the current gain ($K_{ICO}$) of the oscillator 102 and may provide the result of the current gain determination to the HP modulation circuit 220 via the serial bus interface 230. The HP modulation circuit 220 generates and provides high pass modulation data to the first DAC 222 to adjust the tuning current 114 to generate a substantially constant current gain ($K_{ICO}$).

A tuning current carrying phase modulation data may be provided to the first input of the oscillator, at 606. For example, in FIG. 2, the tuning current 114 may carry phase modulation data (i.e., phase modulation data from the HP modulation circuit 220) and may be provided to the first input of the oscillator 102. A frequency of the oscillator 102 (i.e., the oscillation frequency ($f_{OSC}$) of the output signal 118) may be independently responsive to the tuning current 114 and to the tuning voltage 116.

It will be appreciated that the method 600 of FIG. 6 may tune the oscillator 102 with the tuning voltage 116 to compensate for variations (such as PVT variations) and may reduce phase noise generated by the tuning voltage 116 by adjusting the tuning current 114. For example, the oscillation frequency ($f_{OSC}$) may be changed by providing the tuning voltage 116 to the oscillator 102. Changes in the phase of the output signal 118 may result in increased phase noise. The phase of the output signal 118 may be adjusted (e.g., to reduce the phase noise and/or to provide phase modulation) by providing the tuning current 114 to the oscillator 102.

In a particular embodiment, the oscillator may be a hybrid voltage and current controlled oscillator. For example, the oscillator 102 of FIGS. 1-2, the oscillator 302 of FIG. 3, the oscillator 400 of FIG. 4, the oscillator 500 of FIG. 5, or any combination thereof, may be a hybrid voltage and current controlled oscillator. The second input may be coupled to provide the tuning voltage to a variable capacitance element within the oscillator. For example, in FIG. 4, the second input of the oscillator 400 may be coupled to provide the tuning voltage (Vtune) 416 to the varactor 134 (i.e., a variable capacitance element).

In a particular embodiment, the tuning current corresponds to phase modulation data and the tuning voltage corresponds to a center frequency of the oscillator. For example, the tuning current 114 of FIGS. 1-2, the tuning current 314 of FIG. 3, the tuning current 414 of FIG. 4, the tuning current 514a of FIG. 5 or any combination thereof, may correspond to phase modulation data and the tuning voltage 116 of FIGS. 1-2, the tuning voltage 316 of FIG. 3, the tuning voltage 416 of FIG. 4, or any combination thereof may correspond to a center frequency of the oscillator 102 of FIGS. 1-2, the oscillator 302 of FIG. 3, the oscillator 400 of FIG. 4, the oscillator 500 of FIG. 5, or any combination thereof.

In a particular embodiment, the tuning current corresponds to the high pass modulation data input and the tuning current is generated by a digital-to-analog converter (DAC) that is external to the phase-locked loop. For example, in FIG. 2, the tuning current 114 corresponds to a high pass modulation data input (i.e., the first data interface pin 234) and is generated by the first DAC 222 external to the analog PLL. As another example, in FIG. 3, the tuning current 314 corresponds to a high pass modulation data input (i.e., the first data interface pin 334) and is generated by the first DAC 322 external to the DPLL. The tuning current may be responsive to phase modulation data provided to the DAC. For example, in FIGS. 2 and 3, the tuning current 114, 314 is responsive to phase modulation data provided to the first DAC 222, 322, respectively.

In a particular embodiment, the oscillator is included in a phase-locked loop (PLL) and a phase modulated signal is generated at an output of the oscillator based on two point modulation (TPM) input. The TPM input may include a high pass modulation data input and a low pass modulation data input. For example, in FIG. 2, the oscillator 102 is included in the analog PLL and the output signal 118 (i.e., a phase modulated signal) is generated at the output of the oscillator 102 based on a high pass modulation data input (i.e., via the first data interface pin 234) from the HP modulation circuit 220 and a low pass modulation data input (i.e., via the second data interface pin 232) from the LP modulation circuit 224. As another example, in FIG. 3, the oscillator 302 is included in the DPLL and the output signal 318 (i.e., a phase modulated signal) is generated at the output of the oscillator 302 based on a high pass modulation data input (i.e., via the first data interface pin 334) from the HP modulation circuit 320 and a low pass modulation data input (i.e., via the second data interface pin 332) from the LP modulation circuit 324.

In a particular embodiment, the tuning voltage is generated within the PLL. For example, in FIGS. 1-2, the tuning voltage 116 is generated by the low pass filter 110 within the analog PLL. As another example, in FIG. 3, the tuning voltage 316 is generated by the voltage DAC 310 within the DPLL.

In a particular embodiment, the tuning voltage is configured to regulate a center frequency of the oscillator when the phase of the oscillator is adjusted. Regulating the center frequency of the oscillator includes maintaining the center frequency at a substantially constant frequency. For example, in FIGS. 2 and 3, the tuning voltage 116, 316 may regulate a center frequency of the oscillator 102, 302, respectively, while the phase of the oscillator 102, 302 is adjusted. Regulating the center frequency of the oscillator 102, 302 may include maintaining the center frequency at a substantially constant frequency.

In a particular embodiment, a DAC is within a baseband processor and a PLL is within a radio frequency integrated circuit (RFIC). The tuning current may be provided to the first input of the oscillator via a transmitter quadrature baseband input pin. For example, in FIG. 2, the first DAC 222 is within a baseband processor and the analog PLL is within the RFIC 201. The tuning current 114 is provided to the first input of the oscillator 102 via the first data interface pin 234 (e.g., a transmitter quadrature baseband input pin). As another example, in FIG. 3, the first DAC 322 is within a baseband processor and the DPLL is within the RFIC 301. The tuning current 314 is provided to the first input of the oscillator 302 via the first data interface pin 334 (e.g., a transmitter quadrature baseband input pin).

In a particular embodiment, the low pass modulation data is provided via a single data pin. For example, in FIG. 2, the low pass modulation data is provided to the RFIC 201 via the second data interface pin 232. As another example, in FIG. 3, the low pass modulation data is provided to the RFIC 301 via the second data interface pin 332.

In a particular embodiment, a high-pass modulation circuit provides the phase modulation data to the DAC. For example, in FIGS. 2 and 3, the HP modulation circuit 220, 320 may provide the phase modulation data to the first DAC 222, 322, respectively. In a particular embodiment, the tuning current adjusts a phase of the oscillator when the PLL is locked. For example, in FIG. 2, the tuning current 114 may adjust a phase of the oscillator 102 when the analog PLL is locked. As another example, in FIG. 3, the tuning current 314 may adjust a phase of the oscillator 302 when the DPLL is locked.

Figure 7:
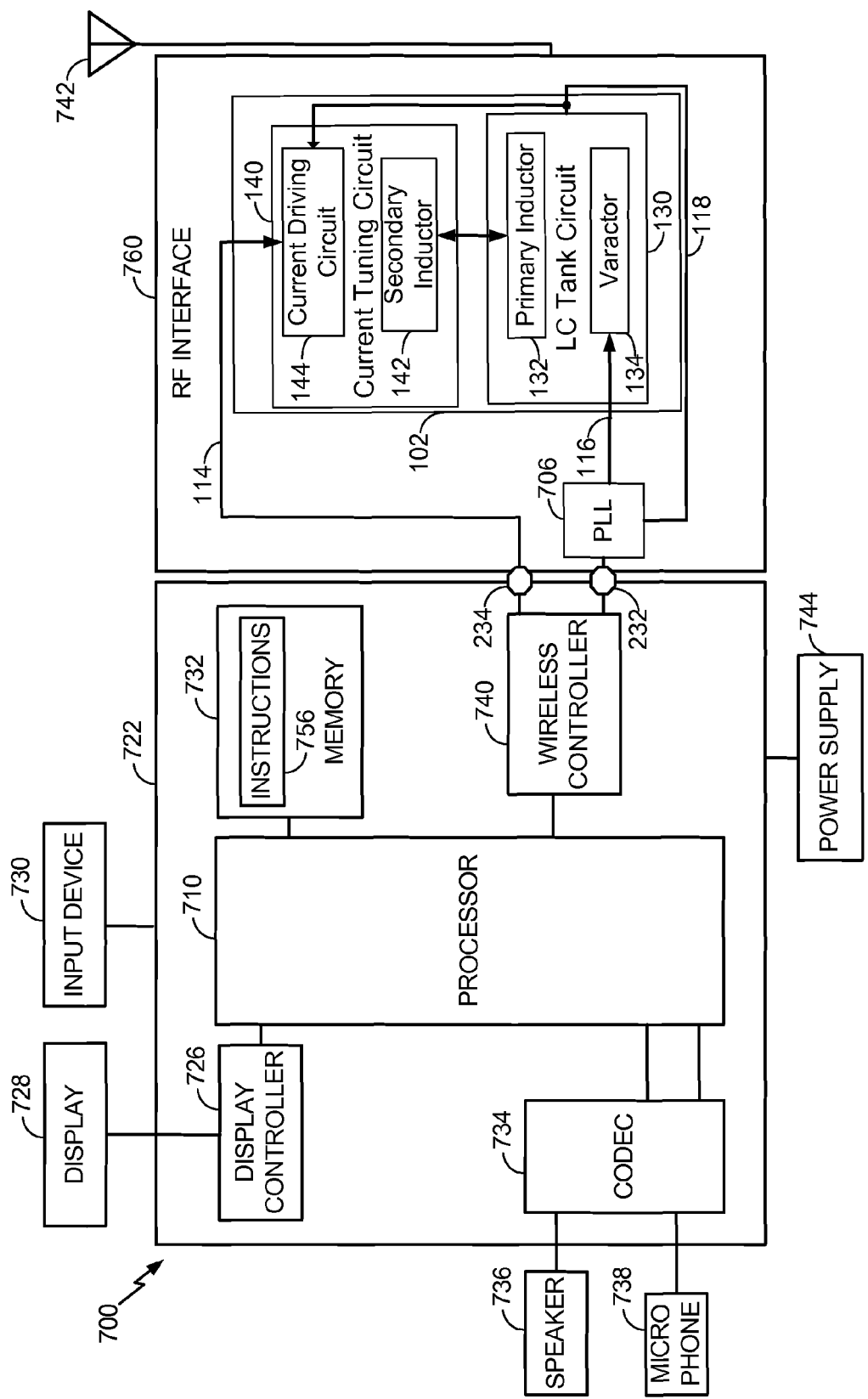
FIG. 7 is a block diagram of a wireless device including a system that is operable to tune an oscillator with a tuning voltage and a tuning current.

Referring to FIG. 7, a block diagram of a particular illustrative embodiment of a wireless communication device is depicted and generally designated 700. The device 700 includes a processor 710, such as a digital signal processor, coupled to a memory 732.

FIG. 7 also shows a display controller 726 that is coupled to the processor 710 and to a display 728. A coder/decoder (CODEC) 734 can also be coupled to the processor 710. A speaker 736 and a microphone 738 can be coupled to the CODEC 734. FIG. 7 also indicates that a wireless controller 740 can be coupled to the digital signal processor 710. A radio frequency (RF) interface 760 disposed between the wireless controller 740 and a wireless antenna 742 includes a PLL 706 coupled to the oscillator 102. The wireless controller 740 and the processor 710 may be coupled to the RF interface 760 via the first and second data interface pins 232, 234. In an alternate embodiment, the wireless controller 740 and the processor 710 may be coupled to the RF interface 760 via the first and second data interface pins 323, 334 of FIG. 3. In an illustrative embodiment, the PLL 706 may correspond to the analog PLL of FIGS. 1-2 or the digital PLL of FIG. 3.

The oscillator 102 may receive the tuning voltage 116 and may receive the tuning current 114. The tuning voltage 116 may be received via the PLL 706, and low pass modulation data may be provided to the PLL 706 from the processor 710 via the first data interface pin 232. The oscillator 102 includes the LC circuit 130 and the current tuning circuit 140. The LC circuit 130 includes the primary inductor 132 and the varactor 134 coupled to the primary inductor 132. The current tuning circuit 140 includes the secondary inductor 142 and the current driving circuit 144 coupled to the secondary inductor 142. The oscillator 102 may receive the tuning voltage 116 at the control input of the varactor 134 and may generate the output signal 118 having the oscillation frequency ($f_{OSC}$) in response to receiving the tuning voltage 116.

The oscillator 102 may also receive the tuning current 114 at the control input of the current driving circuit 144. The tuning current 114 may be provided via the second data interface pin 234. The current driving circuit 144 may be responsive to the tuning current 114 at the control input of the current driving circuit 144. Thus, the oscillator 102 may be a hybrid voltage and current controlled oscillator and the oscillation frequency ($f_{OSC}$) of the output signal 118 may be independently responsive to the tuning voltage 116 provided to the control input of the varactor 134 and to the tuning current 114 provided to the control input of the current driving circuit 144. For example, the secondary inductor 142 may be inductively coupled to the primary inductor 132. An effective inductance of the primary inductor 132 may be adjustable via magnetic coupling to the secondary inductor 142.

The memory 732 may be a tangible non-transitory processor-readable storage medium that includes executable instructions 756. The instructions 756 may be executed by a processor, such as the processor 710 (e.g., a baseband processor as described with respect to FIGS. 1-3), to provide a tuning current 714 to the first input of an oscillator 102. The instructions 756 may also be executable to provide low pass modulation data to the PLL 706, where the PLL 706 provides the tuning voltage 716 to the second input of the oscillator 102.

In a particular embodiment, the processor 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, the power supply 744, and the RF interface 760 are external to the system-on-chip device 722. However, each of the display 728, the input device 730, the speaker 736, the microphone 738, the wireless antenna 742, the power supply 744, and the RF interface 760 can be coupled to a component of the system-on-chip device 722, such as an interface or a controller.

In conjunction with the described embodiments, an apparatus is disclosed that includes an oscillator and means for generating an output signal. For example, the means for generating the output signal may include the oscillator 102 of FIGS. 1 and 2, the oscillator 302 of FIG. 3, the oscillator 400 of FIG. 4, the oscillator 500 of FIG. 5, the processor 710 of FIG. 7 configured to execute the instructions 756 of FIG. 7, one or more other devices, circuits, modules, or processing devices to generate an output signal, or any combination thereof.

The apparatus may also include means for receiving a tuning current to be provided to the means for generating. For example, the means for receiving the tuning current may include the first data interface pin 234 of FIGS. 2 and 7, the first data interface pin 334 of FIG. 3, the processor 710 of FIG. 7 configured to execute the instructions 756 of FIG. 7, one or more other devices, circuits, modules, or processing devices to receive a tuning current, or any combination thereof.

The apparatus may also include means for providing a tuning voltage to the means for generating. For example, the means for providing the tuning current may include the analog PLL of FIGS. 1 and 2, the digital PLL of FIG. 3, the processor 710 of FIG. 7 configured to execute the instructions 756 of FIG. 7, one or more other devices, circuits, modules, or processing devices to provide the tuning voltage, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of generating an oscillating output signal, the method comprising:
providing a tuning current to a first input of an oscillator having a primary inductor that is inductively coupled with a secondary inductor, wherein the oscillator is configured to generate the oscillating output signal, and wherein the tuning current is provided to the secondary inductor through one or more transconductors;
providing a tuning voltage to a second input of the oscillator;
wherein a frequency of the oscillator is independently responsive to the tuning current and to the tuning voltage;

applying a phase shift to the oscillating output signal, wherein the phase-shifted oscillating output signal is configured to control the one or more transconductors such that a phase of a current flow through the secondary inductor is aligned with a phase of a current flow through the primary inductor, wherein applying the phase shift is performed via a phase shifter comprising:
   a p-channel metal oxide semiconductor (PMOS) transistor having a source coupled to a power supply voltage;
   an n-channel metal oxide semiconductor (NMOS) transistor having a source coupled to a reference potential, wherein:
      a gate of the PMOS transistor is coupled to a gate of the NMOS transistor; and
      a drain of the PMOS transistor is coupled to a drain of the NMOS transistor and a gate of one of the transconductors;
   a resistor coupled between the gate of the PMOS transistor and the drain of the PMOS transistor; and
   a capacitor coupled between an output of the oscillator and the gate of the PMOS transistor; and
selectively shunting the phase-shifted oscillating output signal to the reference potential via one or more capacitors, wherein the oscillator is included in a phase-locked loop (PLL), wherein a phase modulated signal is generated at an output of the oscillator based on two point modulation (TPM) inputs, and wherein the TPM inputs include a high pass modulation data input and a low pass modulation data input, wherein the tuning current corresponds to the high pass modulation data input and wherein the tuning current is generated by a digital-to-analog converter (DAC) external to the PLL, and wherein the tuning current is responsive to phase modulation data provided to the DAC.

2. The method of claim 1, wherein the oscillator is a hybrid voltage and current controlled oscillator.

3. The method of claim 1, wherein the second input is coupled to provide the tuning voltage to a variable capacitance element of the oscillator.

4. The method of claim 1, wherein the tuning current corresponds to phase modulation data and wherein the tuning voltage corresponds to a center frequency of the oscillator.

5. The method of claim 1, wherein the tuning voltage is generated within the PLL.

6. The method of claim 1, wherein the DAC is within a baseband processor, wherein the PLL is within a radio frequency integrated circuit (RFIC), and wherein the tuning current is provided to the first input of the oscillator via a transmitter quadrature baseband input pin.

7. The method of claim 1, wherein the low pass modulation data is provided via a single data pin.

8. The method of claim 1, wherein a high-pass modulation circuit provides the phase modulation data to the DAC.

9. The method of claim 8, wherein the tuning current adjusts a phase of the oscillator while the PLL is frequency locked.

10. The method of claim 9, wherein the tuning voltage is configured to regulate a center frequency of the oscillator while the phase of the oscillator is adjusted.

11. The method of claim 10, wherein regulating the center frequency of the oscillator includes maintaining the center frequency at a substantially constant frequency.

12. The method of claim 1, wherein the first input is coupled to provide the tuning current across the secondary inductor within the oscillator, wherein the tuning current across the secondary inductor inductively couples with a current across the primary inductor within the oscillator to change an effective inductance of the primary inductor, and wherein the second input is coupled to provide the tuning voltage to a variable capacitor that is coupled to the primary inductor.

13. The method of claim 12, wherein the frequency of the oscillator is adjusted when the effective inductance of the primary inductor is changed.

14. The method of claim 12, wherein a phase of the oscillator is adjusted when the effective inductance of the primary inductor is changed.

15. An apparatus for generating an oscillating output signal, the apparatus comprising:
   an inductive-capacitive (LC) circuit included in an oscillator comprising:
      a primary inductor; and
      a varactor coupled to the primary inductor, wherein a capacitance of the varactor is responsive to a voltage at a control input of the varactor;
   a current tuning circuit comprising:
      a secondary inductor; and
      a current driving circuit coupled to the secondary inductor and responsive to a current at a control input of the current driving circuit,
   wherein an effective inductance of the primary inductor is adjustable via magnetic coupling to the secondary inductor, and
   wherein a frequency of the oscillating output signal is responsive to the effective inductance of the primary inductor and to the capacitance of the varactor;
   a phase shifter connected to an output of the oscillator, wherein the phase shifter aligns a phase of a current flow through the primary inductor and a phase of a current flow through the secondary inductor, wherein the phase shifter comprises:
      a p-channel metal oxide semiconductor (PMOS) transistor having a source coupled to a power supply voltage;
      an n-channel metal oxide semiconductor (NMOS) transistor having a source coupled to a reference potential, wherein:
         a gate of the PMOS transistor is coupled to a gate of the NMOS transistor; and
         a drain of the PMOS transistor is coupled to a drain of the NMOS transistor and a gate of one of the transconductors;
      a resistor coupled between the gate of the PMOS transistor and the drain of the PMOS transistor; and
      a capacitor coupled between an output of the oscillator and the gate of the PMOS transistor; and
   one or more switches configured to selectively shunt an output of the phase shifter to the reference potential via one or more capacitors, wherein the oscillator is included in a phase-locked loop (PLL), wherein a phase modulated signal is generated at an output of the oscillator based on two point modulation (TPM) inputs, and wherein the TPM inputs include a high pass modulation data input and a low pass modulation data input, wherein the tuning current corresponds to the high pass modulation data input and wherein the tuning current is generated by a digital-to-analog converter (DAC) external to the PLL, and wherein the tuning current is responsive to phase modulation data provided to the DAC.

16. The apparatus of claim 15, wherein the control input of the current driving circuit is coupled to a baseband processor via a first single analog pin.

17. The apparatus of claim 15, further comprising:
the PLL, wherein the LC circuit and the current tuning circuit are included within the oscillator of the PLL and wherein the PLL is coupled to provide the voltage to the control input of the varactor.

18. The apparatus of claim 17, wherein the PLL further includes a divider circuit and wherein a control input of the divider circuit is coupled to a low pass modulation circuit of a baseband processor.

19. The apparatus of claim 18, wherein the control input of the divider circuit is coupled to the low pass modulation circuit via a second single analog pin.

20. The apparatus of claim 15, wherein the frequency of the oscillating output signal is independently responsive to the effective inductance of the primary inductor and independently responsive to the capacitance of the varactor.

21. An apparatus for generating an oscillating output signal, the apparatus comprising:
means for generating an output signal;
means for receiving a tuning current to be provided to the means for generating the output signal, wherein the means for generating the output signal comprises a primary inductor that is inductively coupled with a secondary inductor and wherein the tuning current is provided to the secondary inductor through one or more transconductors;
means for providing a tuning voltage to the means for generating the output signal;
wherein a frequency of the output signal is independently responsive to the tuning current and to the tuning voltage;
means for applying a phase shift to the output signal, wherein the phase-shifted output signal is configured to control the one or more transconductors such that a phase of a current flow through the secondary inductor is aligned with a phase of a current flow through the primary inductor, wherein the means for applying the phase shift comprises:
a p-channel metal oxide semiconductor (PMOS) transistor having a source coupled to a power supply voltage;
an n-channel metal oxide semiconductor (NMOS) transistor having a source coupled to a reference potential, wherein:
a gate of the PMOS transistor is coupled to a gate of the NMOS transistor; and
a drain of the PMOS transistor is coupled to a drain of the NMOS transistor and a gate of one of the transconductors; and
a resistor coupled between the gate of the PMOS transistor and the drain of the PMOS transistor; and
a capacitor coupled between an output of the means for generating the output signal and the gate of the PMOS transistor; and
means for selectively shunting the phase-shifted oscillating output signal to the reference potential via one or more capacitors, wherein the means for generating the output signal includes an oscillator, wherein the oscillator is included in a phase-locked loop (PLL), wherein the output signal includes a phase modulated signal based on two point modulation (TPM) inputs, and wherein the TPM inputs include a high pass modulation data input and a low pass modulation data input, wherein the tuning current is responsive to phase modulation data provided to a digital-to-analog converter (DAC) that is coupled to the means for receiving.

22. The apparatus of claim 21, wherein the tuning voltage is configured to regulate a center frequency of the oscillator while a phase of the oscillator is adjusted.

23. The apparatus of claim 21, wherein the means for receiving is coupled to a high-pass modulation circuit via the DAC.

24. The apparatus of claim 23, wherein the tuning current adjusts a phase of the oscillator while the PLL is locked.

* * * * *